(12) United States Patent
Hu et al.

(10) Patent No.: US 11,256,364 B2
(45) Date of Patent: Feb. 22, 2022

(54) NOISE SUPPRESSION CIRCUIT

(71) Applicant: SENSORTEK TECHNOLOGY CORP., Jhubei (TW)

(72) Inventors: Yao-Sheng Hu, Jhubei (TW); Chun-Kuan Wu, Jhubei (TW); Ching-Jen Tung, Jhubei (TW); Hung-Yen Tai, Jhubei (TW)

(73) Assignee: SENSORTEK TECHNOLOGY CORP., Zhubei (TW)

( * ) Notice: Subject to any disclaimer, the term of this patent is extended or adjusted under 35 U.S.C. 154(b) by 0 days.

(21) Appl. No.: 15/174,044

(22) Filed: Jun. 6, 2016

(65) Prior Publication Data
US 2017/0285862 A1  Oct. 5, 2017

(30) Foreign Application Priority Data
Mar. 29, 2016 (TW) .................. 105109883

(51) Int. Cl.
*G06F 3/041* (2006.01)
*G05F 3/08* (2006.01)
*H03K 17/16* (2006.01)
*G06F 3/044* (2006.01)
*G06F 3/045* (2006.01)

(52) U.S. Cl.
CPC ........... *G06F 3/04182* (2019.05); *G05F 3/08* (2013.01); *G06F 3/045* (2013.01); *H03K 17/16* (2013.01); *G06F 3/044* (2013.01)

(58) Field of Classification Search
CPC ........ G06F 3/0418; G06F 3/044; H03K 17/16
See application file for complete search history.

(56) References Cited

U.S. PATENT DOCUMENTS

| 4,864,155 A * | 9/1989 | Schmitz | H03G 1/04 307/112 |
| 5,140,327 A * | 8/1992 | Bruce | H01L 27/0805 257/E27.048 |
| 7,183,753 B2 * | 2/2007 | Tsuruya | H02M 1/4208 323/222 |
| 7,876,311 B2 * | 1/2011 | Krah | G06F 3/044 178/18.01 |
| 8,106,668 B2 * | 1/2012 | Matsushima | H03K 17/962 324/686 |

(Continued)

FOREIGN PATENT DOCUMENTS

| CN | 101858941 A | 10/2010 |
| CN | 102147678 A | 8/2011 |

(Continued)

*Primary Examiner* — Amy Onyekaba
(74) *Attorney, Agent, or Firm* — Locke Lord LLP; Tim Tingkang Xia, Esq.

(57) ABSTRACT

This disclosure provides a noise suppression circuit for suppressing a noise in a voltage signal. The noise suppression circuit comprises: a switch unit having a first terminal receiving the voltage signal and a second terminal; a capacitor having a first terminal connected to the first terminal of the switch unit and a second terminal grounded; and an analog front-end unit including an operational amplifier with a signal input terminal and a reference-voltage input terminal electrically connected to the second terminal of the switch unit; wherein the switch unit is controlled by a pulse signal.

10 Claims, 3 Drawing Sheets

(56) References Cited

U.S. PATENT DOCUMENTS

| | | | | |
|---|---|---|---|---|
| 8,836,350 B2* | 9/2014 | Peter | | H03K 17/962 |
| | | | | 324/684 |
| 8,884,914 B2* | 11/2014 | Chang | | G06F 3/04184 |
| | | | | 345/174 |
| 9,151,792 B1* | 10/2015 | Kremin | | G06F 1/169 |
| 9,166,621 B2* | 10/2015 | Kremin | | G06F 3/0416 |
| 9,389,256 B2* | 7/2016 | Angelini | | G01R 27/2605 |
| 9,395,850 B2* | 7/2016 | Mamba | | G06F 3/0446 |
| 9,430,088 B1* | 8/2016 | Lee | | G06F 3/044 |
| 9,569,035 B1* | 2/2017 | Lee | | G06F 3/04182 |
| 9,658,722 B2* | 5/2017 | Schwartz | | G06F 3/0418 |
| 9,665,215 B2* | 5/2017 | Tan | | G06F 3/044 |
| 11,139,784 B2* | 10/2021 | Yin | | H04R 3/007 |
| 2005/0134292 A1* | 6/2005 | Knoedgen | | G01D 5/241 |
| | | | | 324/658 |
| 2008/0111714 A1* | 5/2008 | Kremin | | H03M 11/02 |
| | | | | 341/33 |
| 2008/0251721 A1* | 10/2008 | Ueno | | G01J 5/08 |
| | | | | 250/332 |
| 2008/0309628 A1* | 12/2008 | Krah | | G06F 3/04184 |
| | | | | 345/173 |
| 2008/0310655 A1* | 12/2008 | Holzmann | | H04R 3/00 |
| | | | | 381/122 |
| 2009/0110213 A1* | 4/2009 | Holzmann | | H04R 19/016 |
| | | | | 381/95 |
| 2009/0160535 A1* | 6/2009 | Rengachari | | G01R 33/07 |
| | | | | 327/538 |
| 2009/0244014 A1* | 10/2009 | Hotelling | | G06F 3/05 |
| | | | | 345/173 |
| 2010/0060610 A1* | 3/2010 | Wu | | G06F 3/044 |
| | | | | 345/174 |
| 2010/0085322 A1* | 4/2010 | Mamba | | G06F 1/3262 |
| | | | | 345/173 |
| 2010/0085332 A1 | 4/2010 | Takahashi et al. | | |
| 2010/0148806 A1* | 6/2010 | Hargreaves | | G01R 27/2605 |
| | | | | 324/679 |
| 2010/0259283 A1* | 10/2010 | Togura | | H03K 17/955 |
| | | | | 324/679 |
| 2011/0012644 A1* | 1/2011 | Chiu | | H03K 5/249 |
| | | | | 327/94 |
| 2011/0157072 A1* | 6/2011 | Chang | | G06F 3/044 |
| | | | | 345/174 |
| 2011/0158435 A1* | 6/2011 | Ono | | H03F 1/0261 |
| | | | | 381/120 |
| 2011/0163992 A1* | 7/2011 | Cordeiro | | G06F 3/0446 |
| | | | | 345/174 |
| 2011/0193817 A1* | 8/2011 | Byun | | G06F 3/04184 |
| | | | | 345/174 |
| 2012/0050206 A1* | 3/2012 | Welland | | G06F 3/04182 |
| | | | | 345/174 |
| 2012/0081320 A1* | 4/2012 | Hwang | | G06F 3/0445 |
| | | | | 345/173 |
| 2012/0262384 A1* | 10/2012 | Kim | | G06F 3/0418 |
| | | | | 345/173 |
| 2013/0050140 A1 | 2/2013 | Chu | | |
| 2013/0265242 A1* | 10/2013 | Richards | | G06F 3/04182 |
| | | | | 345/173 |
| 2013/0271215 A1* | 10/2013 | Lang | | H03F 1/14 |
| | | | | 330/251 |
| 2013/0278538 A1* | 10/2013 | Brunet | | H03K 17/9622 |
| | | | | 345/174 |
| 2013/0279769 A1* | 10/2013 | Benkley, III | | G06K 9/00013 |
| | | | | 382/124 |
| 2013/0300692 A1* | 11/2013 | Jang | | G06F 3/0446 |
| | | | | 345/173 |
| 2013/0321325 A1* | 12/2013 | Jo | | G06F 3/04182 |
| | | | | 345/174 |
| 2014/0055172 A1* | 2/2014 | Wang | | H03K 17/162 |
| | | | | 327/109 |
| 2014/0125414 A1* | 5/2014 | Chen | | H03F 3/45224 |
| | | | | 330/261 |
| 2014/0267087 A1* | 9/2014 | Yousefpor | | G06F 3/0443 |
| | | | | 345/173 |
| 2014/0292705 A1* | 10/2014 | Tan | | G06F 3/044 |
| | | | | 345/174 |
| 2015/0145535 A1* | 5/2015 | Nys | | H03K 17/955 |
| | | | | 324/679 |
| 2015/0145589 A1* | 5/2015 | Aaltonen | | G06F 3/044 |
| | | | | 327/516 |
| 2015/0153231 A1* | 6/2015 | Sun | | G01J 5/10 |
| | | | | 250/349 |
| 2015/0192946 A1* | 7/2015 | Kwon | | G05F 3/08 |
| | | | | 323/313 |
| 2015/0254491 A1* | 9/2015 | Mo | | G06K 9/0002 |
| | | | | 345/174 |
| 2015/0378511 A1* | 12/2015 | Wu | | G06F 3/04182 |
| | | | | 345/174 |
| 2016/0181988 A1* | 6/2016 | Du | | H03G 3/345 |
| | | | | 330/296 |
| 2016/0202838 A1* | 7/2016 | Lin | | H02M 1/44 |
| | | | | 345/173 |
| 2016/0216296 A1* | 7/2016 | Nakayama | | G01R 15/202 |
| 2016/0224185 A1* | 8/2016 | Hotelling | | G06F 3/0445 |
| 2017/0131838 A1* | 5/2017 | Lu | | G06F 3/0418 |
| 2017/0184645 A1* | 6/2017 | Sawataishi | | G06F 3/04166 |
| 2018/0175804 A1* | 6/2018 | Wang | | H03F 3/45475 |
| 2018/0375422 A1* | 12/2018 | Marumoto | | H02M 1/4208 |

FOREIGN PATENT DOCUMENTS

| | | |
|---|---|---|
| CN | 102289332 A | 12/2011 |
| CN | 202257533 U | 5/2012 |
| CN | 103197812 A | 7/2013 |
| CN | 103575434 A | 2/2014 |
| TW | 475263 B | 2/2002 |
| TW | 201205395 A | 2/2012 |
| TW | 201534860 A | 9/2015 |

* cited by examiner

NOISE SUPPRESSION CIRCUIT

CROSS REFERENCE TO RELATED APPLICATION

This application claims the benefit of Taiwan application Serial No. 105109883, filed Mar. 29, 2016, the disclosure of which is incorporated by reference herein in its entirety.

FIELD OF THE INVENTION

The present invention relates to a noise suppression circuit, and more particularly, to a noise suppression circuit for touch-panel driver circuits.

BACKGROUND OF THE INVENTION

In a touch-panel driver circuit, an analog front-end (AFE) uses operational amplifiers to amplify a weak response signal from a touch sensor and filters to filter a part of noise in the response signal; after that, the amplified and filtered response signal can be conducted to analog-to-digital converters (ADC) and digital signal processors (DSP) in the back-end unit of the touch panel, so as to generate a digitized touch-sensor signal with a better signal-to-noise ratio (SNR). Generally, the operational amplifier is provided with a DC reference voltage generated by a reference-voltage generator.

However, noises often accompany the DC reference voltage during the generation of the DC reference voltage, so that those noises would be amplified by the AFE and thus deteriorate the total SNR of the driver circuit. Therefore, it is in need of new noise suppression means in the touch-panel driver circuit.

SUMMARY OF THE INVENTION

According to one aspect of the present disclosure, one embodiment provides a noise suppression circuit for suppressing a noise in a voltage signal, comprising: a switch unit having a first terminal receiving the voltage signal and a second terminal; a capacitor having a first terminal connected to the first terminal of the switch unit and a second terminal grounded; and an analog front-end unit including an operational amplifier with a signal input terminal and a reference-voltage input terminal electrically connected to the second terminal of the switch unit; wherein the switch unit is controlled by a pulse signal.

According to another aspect of the present disclosure, another embodiment provides a noise suppression circuit for suppressing a noise in a voltage signal, comprising: a switch unit having a first terminal receiving the voltage signal and a second terminal; a capacitor having a first terminal connected to the first terminal of the switch unit and a second terminal grounded; and an analog front-end unit including an operational amplifier with a signal input terminal and a reference-voltage input terminal electrically connected to the second terminal of the switch unit; wherein the switch unit is controlled by a pulse signal, and the analog front-end unit further includes a second reference-voltage generator with an input terminal connected to the second terminal of the switch unit and an output terminal connected to the reference-voltage input terminal of the operational amplifier.

According to still another aspect of the present disclosure, another embodiment provides a noise suppression circuit for suppressing a noise in a voltage signal, comprising: a switch unit having a first terminal receiving the voltage signal and a second terminal; a capacitor having a first terminal connected to the first terminal of the switch unit and a second terminal grounded; and an analog front-end unit including an operational amplifier with a signal input terminal and a reference-voltage input terminal electrically connected to the second terminal of the switch unit; wherein the switch unit is controlled by a pulse signal, the voltage signal is a DC voltage generated by a third reference-voltage generator with an output terminal connected to the first terminal of the switch unit, and the noise suppression circuit further includes a fourth reference-voltage generator with an input terminal connected to the output terminal of the third reference-voltage generator and an output terminal connected to the first terminal of the switch unit.

Further scope of applicability of the present application will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below and the accompanying drawings which are given by way of illustration only, and thus are not limitative of the present invention and wherein.

DESCRIPTION OF THE EXEMPLARY EMBODIMENTS

For your esteemed members of reviewing committee to further understand and recognize the fulfilled functions and structural characteristics of the invention, several exemplary embodiments cooperating with detailed description are presented as the follows.

In the following embodiments of the present disclosure, when an element is described to be disposed above/mounted on top of or below/under another element, it comprises either the element is directly or indirectly disposed above/below the other element, i.e. when indirectly, there can be some other element arranged between the two; and when directly, there is no other element disposed between the two. It is noted that the descriptions in the present disclosure relate to "above" or "below" are based upon the related diagrams provided, but are not limited thereby. Moreover, the terms "first", "second", and "third", and so on, are simply used for clearly identifying different elements of the same nature, but those elements are not restricted thereby and must be positioned or arranged accordingly. In addition, the size or thickness of each and every element provided in the following diagrams of the present disclosure is only schematic representation used for illustration and may not represent its actual size.

The noise suppression circuits disclosed in the embodiments can be used to suppress the noise included in a voltage signal in driver circuits, the one for the art of touch panel especially. In a touch panel, an AFE uses an operational amplifier to amplify a weak response signal from a touch sensor and a filter to filter a part of noise in the response signal; after that, the amplified and filtered response signal can be conducted to an ADC and a DSP in the back-end unit of the touch panel. Generally, the operational amplifier is provided with a DC reference voltage which inevitably contains noises. In the present disclosure, the noise suppression circuits are used to suppress the noise included in such voltage signals; but it is not limited thereto, the embodiments can also be used in the circuitry modules like sensors.

Figure 1:
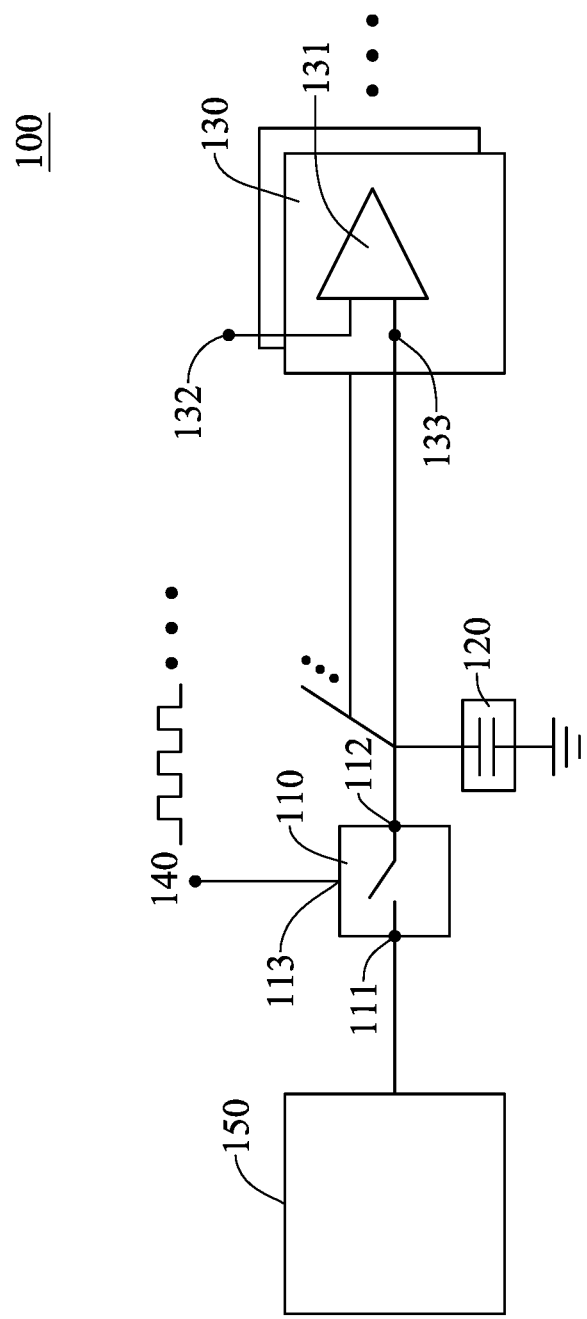
FIG. 1 is a block diagram of a noise suppression circuit according to a first embodiment of the present disclosure.

Please refer to FIG. 1, which is a block diagram of a noise suppression circuit 100 according to a first embodiment of the present disclosure. The noise suppression circuit 100 includes a switch unit 110, a capacitor 120, and an AFE unit 130; wherein, the switch unit 110 may have an input terminal 111 for receiving an input signal, an output terminal 112 for outputting an output signal, and a control terminal 113 for deciding whether the input signal is transmitted to the output terminal 112 or not. A voltage signal with noises to be suppressed may enter the noise suppression circuit 100 by applying it to the input terminal 111. The AFE unit 130 may include an operational amplifier 131 and a filter (not shown); wherein the operational amplifier 131 may have a signal input terminal 132 for receiving a signal to be amplified and a reference-voltage input terminal 133 for receiving a reference-voltage signal. For example, the signal applying to the signal input terminal 132 may be a response signal from a touch-panel sensor, capacitive or resistive, or from a temperature sensor in a display driver circuit. As shown in FIG. 1, the output terminal 112 of the switch unit 110 is connected to the capacitor 120 and the AFE unit 130 by connecting both one terminal of the capacitor 120 and the reference-voltage input terminal 133 of the operational amplifier 131 to the output terminal 112 of the switch unit 110, with the other terminal of the capacitor 120 grounded.

In the embodiment, the voltage signal is a DC reference voltage with noises, and a pulse signal 140 is applied to the switch unit 110 at the control terminal 113 to control the switching of the input signal from the input terminal 111 to the output terminal 112. The pulse signal 140 is a pulse train with alternate logic high and low voltage levels. For example, the pulse signal 140 may be a built-in digital clock in a driver circuit for touch panels. When the pulse signal 140 is logic high, the touch panel is in its detecting phase and the driver circuit is used to detect whether the touch panel is touched or not. On the other respect, when the pulse signal 140 is logic low, the touch panel is in its displaying phase and the driver circuit is used to light up the touch panel. In a commercially available touch panel driver, the built-in clock may have a logic high duration of about 200 μs and a logic low duration of more than 100 μs in a period. In other words, the built-in clock is on about 200 μs but off about 100 μs in a period, and its duty cycle is about 33%. But it is not limited thereto; the pulse signal may have a different shape in the other embodiments.

Because the AFE unit 130 is used to amplify the weak response signal from a touch sensor which is received at the signal input terminal 132, the operational amplifier 131 needs to work only when the pulse signal 140 is logic high. In this duration, the reference-voltage signal received at the reference-voltage input terminal 133 is useful to the operational amplifier 131, and the switch unit 110 is turned on to be able to transmit the DC reference voltage with noises from the input terminal 111 to the output terminal 112. Here, as shown in FIG. 1, the output terminal 112 of the switch unit 110 is connected to the capacitor 120 that has one terminal grounded, so the high-frequency noises in the DC reference voltage would be electrically coupled to the ground by the way of the capacitor 120, and the capacitor 120 would be charged by the DC reference voltage. In the embodiment, the capacitor 120 may have a capacitance of about 1 pF, so it would be fast charged to have a terminal voltage equal to the DC reference voltage. When the pulse signal 140 is then switched to logic low, the switch unit 110 is turned off so that the DC reference voltage in the capacitor 120 with its noises being removed is transmitted to the reference-voltage input terminal 133 of the operational amplifier 131. Because the pulse signal 140 is logic low and it is impossible for the capacitor 120 to introduce additional noises, the noises would be very low at the reference-voltage input terminal 133; thus, the noises in the DC reference voltage would be well suppressed. In the noise suppression circuit 100 including the switch unit 110 and the capacitor 120, the digital clock built in the touch panel driver circuits is connected to the control terminal 113 to control the switch unit 110, so that the embodiment can suppress the noises in the DC reference voltage effectively when the touch panel is in the detecting phase. Thereby, the operational amplifier 131 in the AFE unit 130 can function well because the noises in the DC reference voltage have been suppressed and hence the SNR is improved.

In the above embodiment, the DC reference voltage is generated by a reference-voltage generator 150, and the reference-voltage generator 150 may be one of a voltage buffer, a level shifter, a DC-DC converter, and a voltage regulator, each of which can provide the operational amplifier 131 with a constant DC voltage having low noises as the reference voltage. In another embodiment, the noise suppression circuit 100 may have a plurality of AFE units 130 connected in parallel and sharing one switch unit 110 and one capacitor 120, as shown in FIG. 1. For example, a state-of-the-art touch panel may have 28 AFE units 130, and the noise suppression circuit 100 according to the embodiment can use only one switch unit 110 and one capacitor 120 to provide the AFE units 130 with an equal DC reference voltage.

Figure 2:
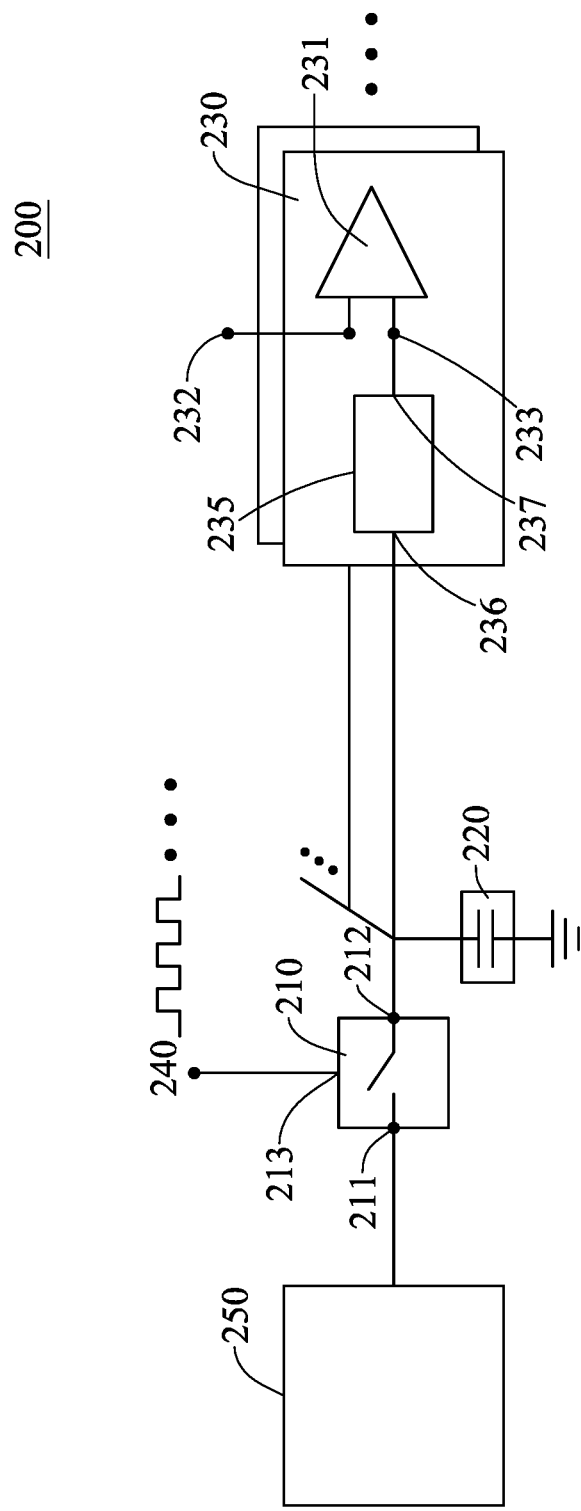
FIG. 2 is a block diagram of a noise suppression circuit according to a second embodiment of the present disclosure.

FIG. 2 is a block diagram of a noise suppression circuit 200 according to a second embodiment of the present disclosure. The noise suppression circuit 200 includes a switch unit 210, a capacitor 220, an AFE unit 230 and a first reference-voltage generator 250; wherein, the switch unit 210 may have an input terminal 211, an output terminal 212 and a control terminal 213, and a pulse signal 240 is applied to the switch unit 210 at the control terminal 213 to control the switching of the input signal from the input terminal 211 to the output terminal 212. The AFE unit 230 may include an operational amplifier 231, a filter (not shown), and a second reference-voltage generator 235; wherein the operational amplifier 231 may have a signal input terminal 232 and a reference-voltage input terminal 233. A signal received at the signal input terminal 232 may be a response signal from a touch-panel sensor, capacitive or resistive, or from a temperature sensor in a display driver circuit. Basically, the switch unit 210, the capacitor 220, the AFE unit 230, the operational amplifier 231, the pulse signal 240, and the first reference-voltage generator 250 respectively correspond to the switch unit 110, the capacitor 120, the AFE unit 130, the operational amplifier 131, the pulse signal 140, and the reference-voltage generator 150 as set forth in the first embodiment, and the recitation is not repeated here.

The noises in the DC reference voltage generated by the first reference-voltage generator 250 can be suppressed by the combination of the switch unit 210 and the capacitor 220. However, another reference-voltage generator can be disposed between the operational amplifier 231 and the capacitor 220 to prevent the distortion of the voltage signal at the output terminal 212, if the operational amplifier 231 extracts some current from the capacitor 220. Thus, in the embodiment, the AFE unit 230 further includes the second reference-voltage generator 235 with its input terminal 236 connected to the output terminal 212 of the switch unit 210 to receive the DC reference voltage from the switch unit 210, and its output terminal 237 connected to the reference-voltage input terminal 233 of the operational amplifier 231 so as to improve the driving capacity of the operational amplifier 231. Here, the voltage distortion caused by the phenomenon in which the operational amplifier 231 extracts some current from the capacitor 220 can be prevented, and hence a better DC reference voltage can be applied to the operational amplifier 231. The second reference-voltage generator 235 may be one of a voltage buffer, a level shifter, a DC-DC converter, and a voltage regulator, each of which can diminish the effect of the current leakage upon the DC reference voltage.

Figure 3:
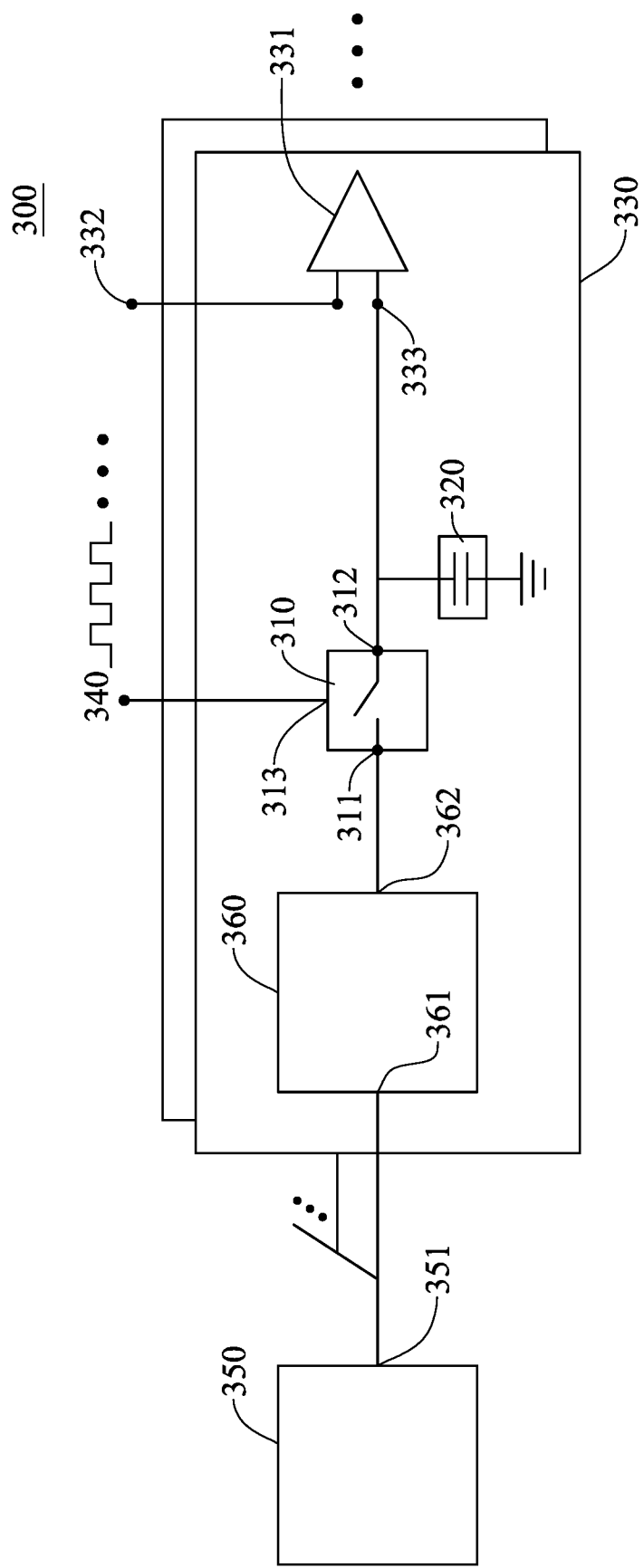
FIG. 3 is a block diagram of a noise suppression circuit according to a third embodiment of the present disclosure.

FIG. 3 is a block diagram of a noise suppression circuit 300 according to a third embodiment of the present disclosure. The noise suppression circuit 300 includes an AFE unit 330 and a third reference-voltage generator 350; wherein, the third reference-voltage generator 350 is used to provide the AFE unit 330 with a DC reference voltage, and it corresponds to the reference-voltage generator 150 as set forth in the first embodiment, and the recitation is not repeated here. In another embodiment, the noise suppression circuit 300 may have a plurality of AFE units 330 connected in parallel and sharing the third reference-voltage generator 350, as shown in FIG. 3. For example, a state-of-the-art touch panel may have 28 AFE units 330, and the noise suppression circuit 300 according to the embodiment can use only one reference-voltage generator 350 to provide the AFE units 330 with an equal DC reference voltage.

As set forth above, some noises may be included in the DC reference voltage from a reference-voltage generator. Thus, in the embodiment, the AFE unit 330 includes a fourth reference-voltage generator 360, a switch unit 310, a capacitor 320, and an operational amplifier 331; wherein, the fourth reference-voltage generator 360 may have an input terminal 361 and an output terminal 362. The input terminal 361 is connected to the output terminal 351 of the third reference-voltage generator 350 which may generate a DC reference voltage including noises, and the output terminal 362 is connected to the input terminal 311 of the switch unit 310 so as to improve the driving capacity of the DC reference voltage. Thus, a better DC reference voltage can be applied to the switch unit 310 and the capacitor 320 for a further noise suppression process. The fourth reference-voltage generator 360 may be one of a voltage buffer, a level shifter, a DC-DC converter, and a voltage regulator, each of which can diminish the effect of the current leakage upon the DC reference voltage.

The switch unit 310 may have an input terminal 311, an output terminal 312 and a control terminal 313, and a pulse signal 340 is applied to the switch unit 310 at the control terminal 313 to control the switching of the input signal from the input terminal 311 to the output terminal 312. The operational amplifier 331 may have a signal input terminal 332 and a reference-voltage input terminal 333. A signal received at the signal input terminal 332 may be a response signal from a touch-panel sensor, capacitive or resistive, or from a temperature sensor in a display driver circuit. The switch unit 310, the capacitor 320, the operational amplifier 331, and the pulse signal 340 respectively correspond to the switch unit 110, the capacitor 120, the operational amplifier 131, and the pulse signal 140 as set forth in the first embodiment, and the recitation is not repeated here. Also, as described in the first embodiment, the combination of the switch unit 310 and the capacitor 320 can suppress the noises included in the DC reference voltage effectively, and hence a better DC reference voltage can be applied to the operational amplifier 331.

With respect to the above description then, it is to be realized that the optimum dimensional relationships for the parts of the invention, to include variations in size, materials, shape, form, function and manner of operation, assembly and use, are deemed readily apparent and obvious to one skilled in the art, and all equivalent relationships to those illustrated in the drawings and described in the specification are intended to be encompassed by the present invention.

What is claimed is:

1. A noise suppression circuit for suppressing a noise in a voltage signal generated by a reference-voltage generator, comprising:

a switch unit having a first terminal receiving the voltage signal and a second terminal;

a capacitor having a first terminal electrically connected to the second terminal of the switch unit and a second terminal grounded, and the capacitor being charged by the voltage signal through the switch unit when the switch unit is turned on and generating a reference-voltage signal when the switch unit is turned off, whereby the noise in the voltage signal generated by the reference-voltage generator is suppressed by the switch and the capacitor when the switch unit is turned off and the reference-voltage signal is generated; and an analog front-end unit including an operational amplifier with a signal input terminal for receiving a to-be-amplified signal and a reference-voltage input terminal electrically connected to the second terminal of the switch unit and the first terminal of the capacitor, wherein the reference-voltage input terminal receives the reference-voltage signal from the capacitor when the switch unit is turned off;

wherein the switch unit is controlled by a pulse signal.

2. The noise suppression circuit of claim 1, wherein the reference-voltage generator is a first reference-voltage generator, and the voltage signal is a DC voltage generated by the first reference-voltage generator.

3. The noise suppression circuit of claim 2, wherein the first reference-voltage generator is a voltage buffer, a level shifter, a DC-DC converter, or a voltage regulator.

4. The noise suppression circuit of claim 1, wherein the analog front-end unit further includes a second reference-voltage generator with an input terminal connected to the second terminal of the switch unit and an output terminal connected to the reference-voltage input terminal of the operational amplifier.

5. The noise suppression circuit of claim 4, wherein the second reference-voltage generator is a voltage buffer, a level shifter, a DC-DC converter, or a voltage regulator.

6. The noise suppression circuit of claim 1, wherein the voltage signal is a DC voltage generated by a third reference-voltage generator with an output terminal connected to the first terminal of the switch unit.

7. The noise suppression circuit of claim 6, wherein the third reference-voltage generator is a voltage buffer, a level shifter, a DC-DC converter, or a voltage regulator.

8. The noise suppression circuit of claim 6, further comprising a fourth reference-voltage generator with an input terminal connected to the output terminal of the third reference-voltage generator and an output terminal connected to the first terminal of the switch unit.

9. The noise suppression circuit of claim 8, wherein the fourth reference-voltage generator is a voltage buffer, a level shifter, a DC-DC converter, or a voltage regulator.

10. The noise suppression circuit of claim 1, configured for driving a touch panel.

\* \* \* \* \*